(12) United States Patent
Fredrickson et al.

(10) Patent No.: US 7,350,122 B2
(45) Date of Patent: Mar. 25, 2008

(54) METHOD, APPARATUS AND COMPUTER PROGRAM PRODUCT FOR IMPLEMENTING SCAN-CHAIN-SPECIFIC CONTROL SIGNALS AS PART OF A SCAN CHAIN

(75) Inventors: Mark S. Fredrickson, Rochester, MN (US); Scott Douglas Frei, Rochester, MN (US); Steven Paul Jones, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/266,744

(22) Filed: Nov. 3, 2005

(65) Prior Publication Data

US 2007/0101221 A1    May 3, 2007

(51) Int. Cl.
*G01R 31/28* (2006.01)
(52) U.S. Cl. .................. 714/726; 714/729; 714/731
(58) Field of Classification Search .............. None
See application file for complete search history.

(56) References Cited

U.S. PATENT DOCUMENTS

| 6,779,143 B2 * | 8/2004 | Grisenthwaite ............. 714/727 |
| 2004/0148554 A1 * | 7/2004 | Dervisoglu et al. ......... 714/727 |

* cited by examiner

*Primary Examiner*—Jacques Louis-Jacques
*Assistant Examiner*—John J. Tabone, Jr.
(74) *Attorney, Agent, or Firm*—Joan Pennington

(57) ABSTRACT

A method, apparatus and computer program product are provided for implementing scan-chain-specific control signals as an integral part of a scan chain. A scan input vector including scan data input and a scan control signal is applied to a register latch that forms the scan chain. The register latch includes a logic gate for combining a global clock control (THOLD) signal and the scan control signal. The scan control signal is routed around the register latch and including in a scan output vector including scan data output. Chain-specific control signals are eliminated from a clock control signal distribution tree used with the scan chain of the invention.

7 Claims, 10 Drawing Sheets

METHOD, APPARATUS AND COMPUTER PROGRAM PRODUCT FOR IMPLEMENTING SCAN-CHAIN-SPECIFIC CONTROL SIGNALS AS PART OF A SCAN CHAIN

FIELD OF THE INVENTION

The present invention relates generally to the data processing field, and more particularly, relates to a method, apparatus and computer program product for implementing scan-chain-specific control signals as an integral part of a scan chain.

DESCRIPTION OF THE RELATED ART

In some of today's complex integrated circuits clock control signals often are used to gate the clock signals for all or part of the chip. These signals are used to turn off the clocks to the entire chip or to different parts of the chip as may be needed for a variety of reasons, such as power savings, chip configuration, thermal management, and the like. The global clock control signals can be called THOLD signals.

In some integrated circuit chips, different sections of the clock control tree may be gated by unique clock gate signals. These signals allow the clocks to be turned off/on for different portions of the design. A design requirement that may be imposed is that all of the storage elements that are controlled by one of these gated sections of the clock control tree must be in the same scan chain.

For example, FIG. 1A illustrates a conventional scan chain including chain-specific clock gate signals called scan_enable signals. As shown, the scan_enable (0)-(N−1) signals are used to allow certain parts of the chip to continue running while other parts of the chip are quiesced and possibly even scanned. Each latch, register, and the like in a particular scan chain must be connected to the chain-specific clock control signal for that scan chain. Currently, substantially manual, iterative processes that are both time consuming and cumbersome are required to design scan chains as shown in FIG. 1A.

FIG. 1B illustrates a conventional level sensitive scan design (LSSD) latch of FIG. 1A including a logic control block (LCB) receiving the clock and the chain-specific clock control signal for the particular scan chain and a register (REG) receiving the chain n scan_in and data in and providing chain n scan_out and data out.

FIG. 1C illustrates scan-testing operation of a prior art LSSD latch chain arrangement. The same scan_enable signals that are used to gate different portions of the clock control tree are used in a logic built-in self-test (LBIST) engine to enable the corresponding scan chains. This design requirement forces a dependency between gated sections of the clock control tree and the scan chains. While this arrangement allows the logic in individual scan chains to be stopped and possibly scanned independently of the other scan chains, it does cause some serious difficulties in the logic design and timing closure process.

Using this clock control method for logic scan chains, the leaf-nodes of the clock-control distribution tree are not all functionally equivalent and the clock control tree leaf-nodes are associated with specific scan chains. Serious drawbacks for this clock control method result, currently causing significant additional time and tool resource to assure proper operation including:

Latches cannot be moved freely between scan chains for scan chain balancing. To move a latch to a new scan chain, the clock control signals also have to be changed using the leaf-nodes that correspond to the new scan chain. As the chip floorplan evolves, latches are moved around in the floorplan. The clock control distribution tree may be designed to not move around. When a latch has moved in the floorplan it would be desirable to connect that latch to the closest leaf-node of clock control tree, treating the clock control tree like the clock grid itself. However, this is often not possible without also changing the scan chain for the latch, because the leaf-nodes are associated with a specific scan chain. The scan-chain balancing that is normally done late in the design cycle cannot be uncoupled from the design of the clock control distribution tree.

SUMMARY OF THE INVENTION

Principal aspects of the present invention are to provide a method, apparatus and computer program product for implementing scan-chain-specific control signals as an integral part of a scan chain. Other important aspects of the present invention are to provide such method, apparatus and computer program product for implementing scan-chain-specific control signals as an integral part of a scan chain substantially without negative effect and that overcome many of the disadvantages of prior art arrangements.

In brief, a method, apparatus and computer program product are provided for implementing scan-chain-specific control signals as an integral part of a scan chain. A scan input vector including scan data input and a scan control signal is applied to a register latch that forms the scan chain. The register latch includes a logic gate for combining a global clock control (THOLD) signal and the scan control signal. The scan control signal is routed around the register latch and including in a scan output vector including scan data output.

In accordance with features of the invention, chain-specific control signals are eliminated from a clock control signal distribution tree used with the scan chain of the invention.

In accordance with features of the invention, an AND gate receives the scan control signal of the scan input vector and the global clock control (THOLD) signal. The scan input vector can include a plurality of bits N, one bit for scan data input and N−1 bits for chain-specific control signals.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In accordance with features of the invention, design methods are provided whereby the chain-specific signals, such as scan_enables, are removed from the clock-control distribution tree, and these chain-specific signals are distributed as part of the scan chain itself. Each scan chain includes a scan vector of 2 or more bits, instead of the conventional singular scan input signal applied to a register and scan output signal provided by the register in a scan chain. In the new scan vector, one of the bits handles the scan data and the other bit or bits are used for the chain-specific control signals.

In accordance with features of the invention, the clock-control tree design is effectively de-coupled from the scan-chain design. This resolves many problems described above of the conventional clock control method for logic scan chains. This de-coupling also permits designers to use some general design tools such as tree construction tools for the clock-control signal tree, and scan chain balancing and optimization tools for routing the scan chain.

In accordance with features of the invention, an advantage is that since the scan chain data and the corresponding scan chain controls are designed and routed as a vector, reducing work and reducing the possibility of connecting the wrong controls to the wrong scan chain.

Figure 1A:
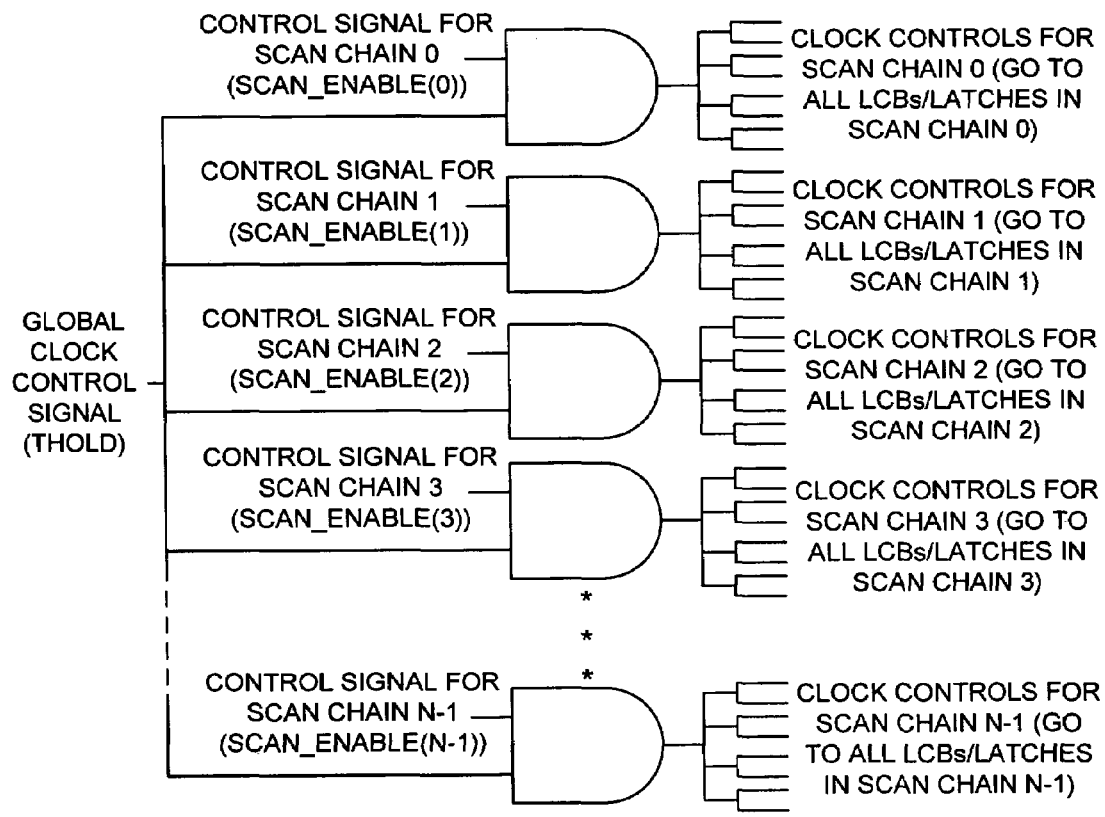
FIG. 1A is a schematic diagram of a prior art clock control tree arrangement including a chain specific clock control signal for each scan chain.
Figure 1B:
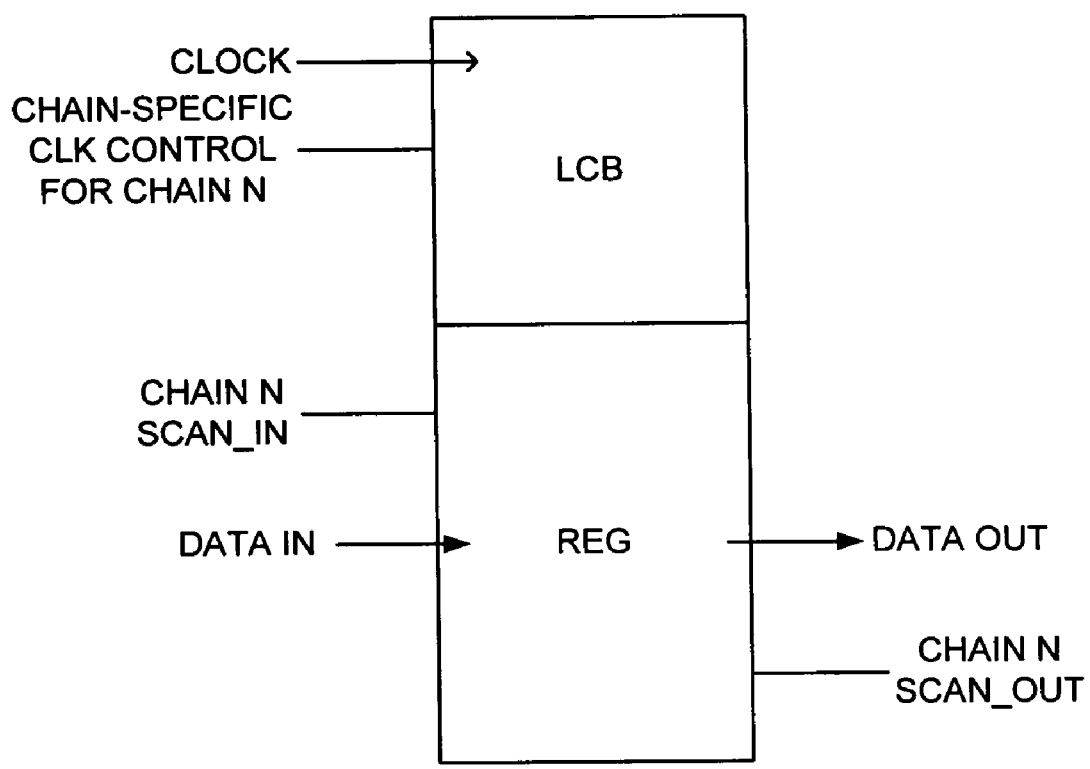
FIG. 1B is a block diagram of a prior art level sensitive scan design (LSSD) latch of FIG. 1.
Figure 1C:
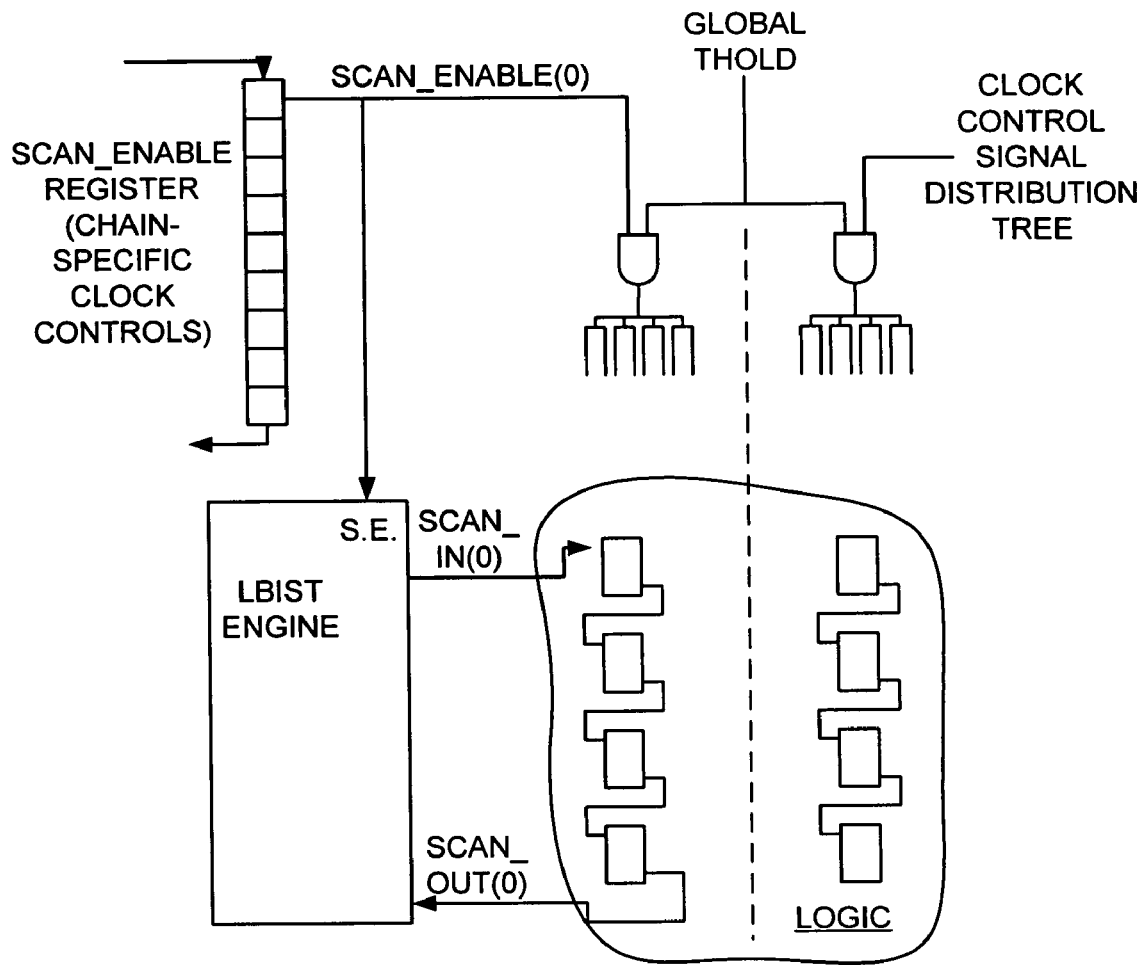
FIG. 1C is a block diagram illustrating scan testing operation of a prior art LSSD latch chain arrangement.
Figure 2:
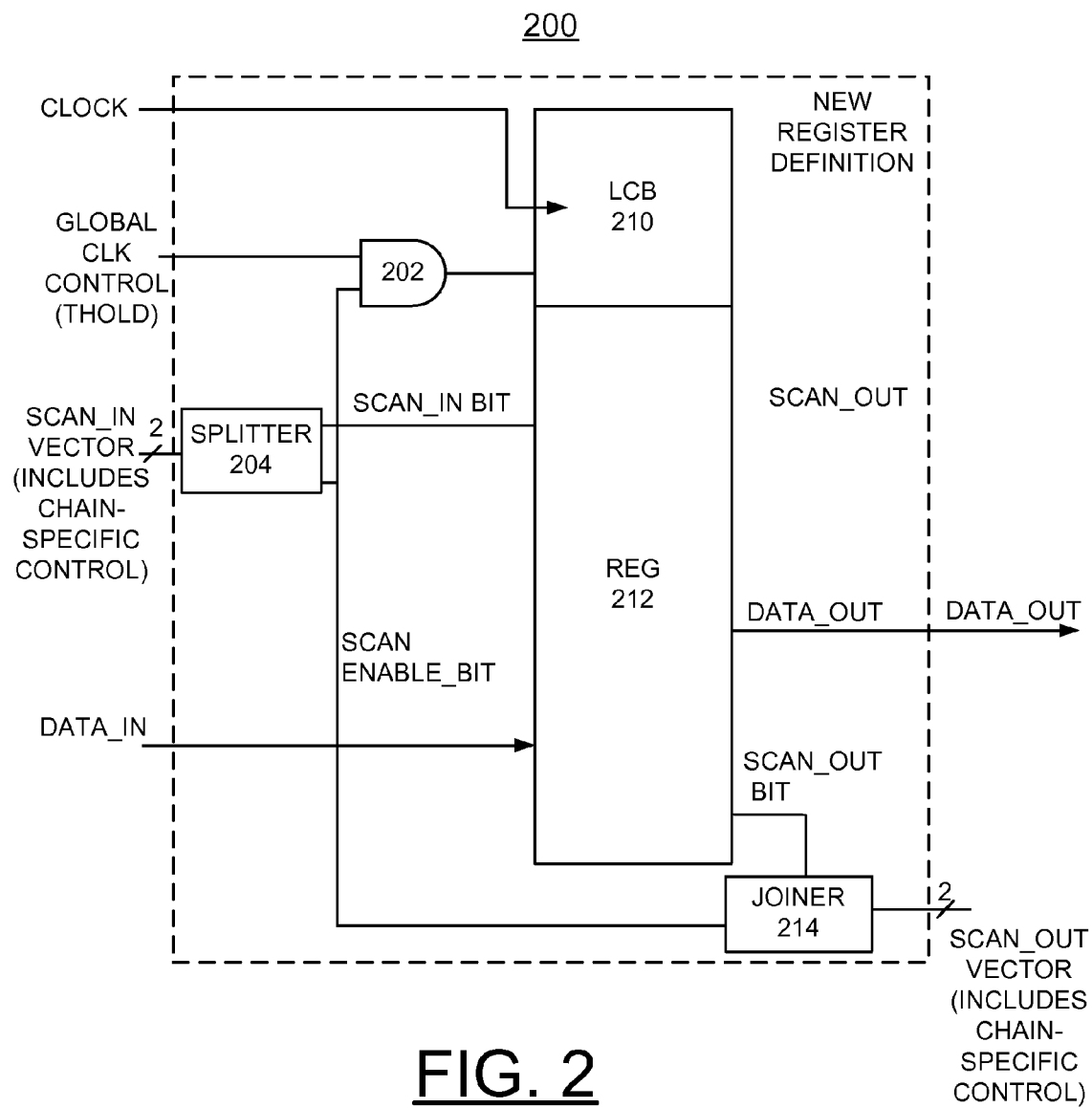
FIG. 2 illustrates an exemplary register latch for implementing scan-chain-specific control signals as an integral part of a scan chain in accordance with the preferred embodiment.

Having reference now to the drawings, in FIG. 2, there is shown an exemplary register latch generally designated by the reference character 200 for implementing scan-chain-specific control signals as an integral part of a scan chain in accordance with the preferred embodiment. Register latch 200 enables removing the chain-specific control signals, such as scan_enables from the clock control (THOLD) tree. Register latch 200 routes the chain-specific control signals, such as scan_enables as part of each scan chain itself.

As illustrated in FIG. 2, an input signal SCAN_IN VECTOR is a two-bit vector, one bit (0) used for the scan data itself, and the other bit (1) is used, for example the scan_enable associated with that chain. It should be understood that the input signal SCAN_IN VECTOR in accordance with the invention is not limited to a two-bit vector. For example, the input signal SCAN_IN VECTOR can be implemented with an N-bit vector, with one bit used for the scan data and N−1 bits used for chain-specific control signals. It should be understood that including chain-specific signals as part of the scan chain itself is not be limited to scan_enable signals. There may be other chain-specific signals, which advantageously are also routed as part of the scan chains.

Register latch 200 includes an AND gate 202 receiving a global clock control THOLD signal and the chain-specific control signal or the scan_enable signal from a vector-splitter 204 receiving the 2-bit scan_in vector. Register latch 200 includes a local clock buffer (LCB) 210 receiving a clock input CLOCK and the AND gated global clock-control THOLD signal by the chain-specific control signal at the output of AND gate 202. Register latch 200 includes a register REG 212 receiving a data input DATA_IN and a scan data input SCAN_IN from the vector-splitter 204. The register REG 212 provides a data output DATA_OUT and a scan data output SCAN_OUT. The chain-specific control signal or the scan_enable signal from the vector-splitter 204 is routed around the register latch 200 to provide at a vector-joiner 214 a two-bit output vector SCAN_OUT VECTOR.

Figure 3:
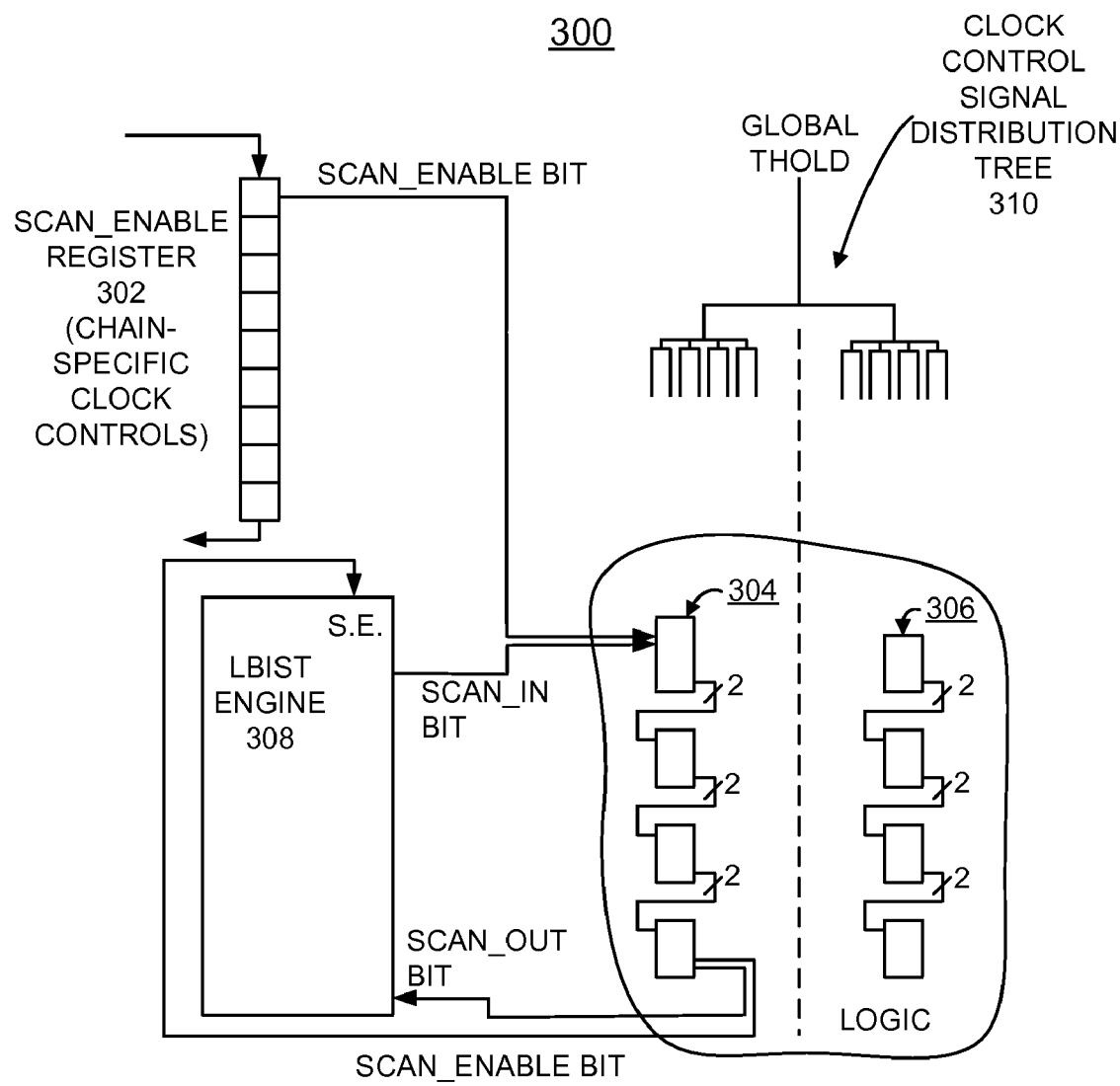
FIG. 3 illustrates an exemplary scan chain apparatus for implementing methods for handling scan-chain-specific control signals as an integral part of a scan chain in accordance with the preferred embodiment.

FIG. 3 illustrates an exemplary scan chain apparatus generally designated by the reference character 300 for implementing methods for handling scan-chain-specific control signals as an integral part of a scan chain in accordance with the preferred embodiment. Scan chain apparatus 300 includes a scan_enable register 302 applying the chain-specific control signal or the scan_enable signal to a scan chain 304 and a scan chain 306. The scan chain 306 is shown in simplified form without test connections. A logic built-in self-test (LBIST) engine 308 provides the scan data to the scan chain 304. As a result of removing the chain-specific signals from the clock-control tree, a generic signal distribution tree 310 is coupled to the scan chain 304. The LBIST engine 308 receives the scan_enable signal from the scan chain 304, eliminating the need for the conventional connection between the LBIST engine and the scan_enable register.

As a result of the LBIST engine 308 receiving the scan_enable signal from the scan chain 304, the LBIST engine 308 can identify exactly which scan chains have been successfully enabled. In the current state of the art the LBIST engine knows which scan chains should be enabled but does not have any feedback from the scan chains themselves to indicate that they are truly enabled.

Simply adding the gate 202 to the input side of the LCB 210 could increase the setup time required for the incoming global clock control signal (THOLD). Several things could be done to reduce this additional setup time. One option would be to add another input on the existing gate in the LCB instead of adding a new gate, as illustrated in FIG. 4.

Figure 4:
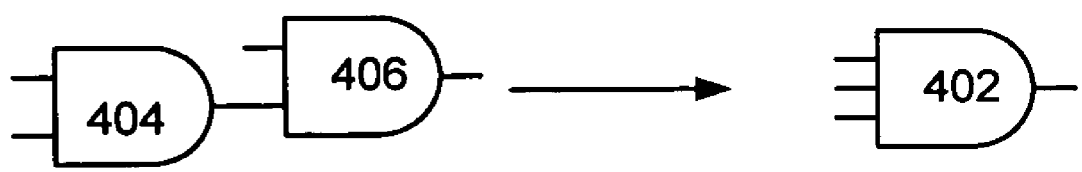
FIG. 4 illustrates exemplary input logic forming a part of a local clock buffer (LCB) for implementing scan-chain-specific control signals as an integral part of a scan chain in accordance with the preferred embodiment.

FIG. 4 illustrates exemplary input logic forming a part of a local clock buffer (LCB) generally designated by the reference character 400 for implementing scan-chain-specific control signals as an integral part of a scan chain in accordance with the preferred embodiment. As shown in FIG. 4, a logic gate 402 or a pair of logic gate 404, 406 for enabling specific scan chains can be built into the LCB 400 or register design. For example, the three-input AND gate 402 can replace an existing two-input AND gate in the LCB, with the additional input receiving a chain-specific control signal, such as, the scan_enable signal.

Figure 5:
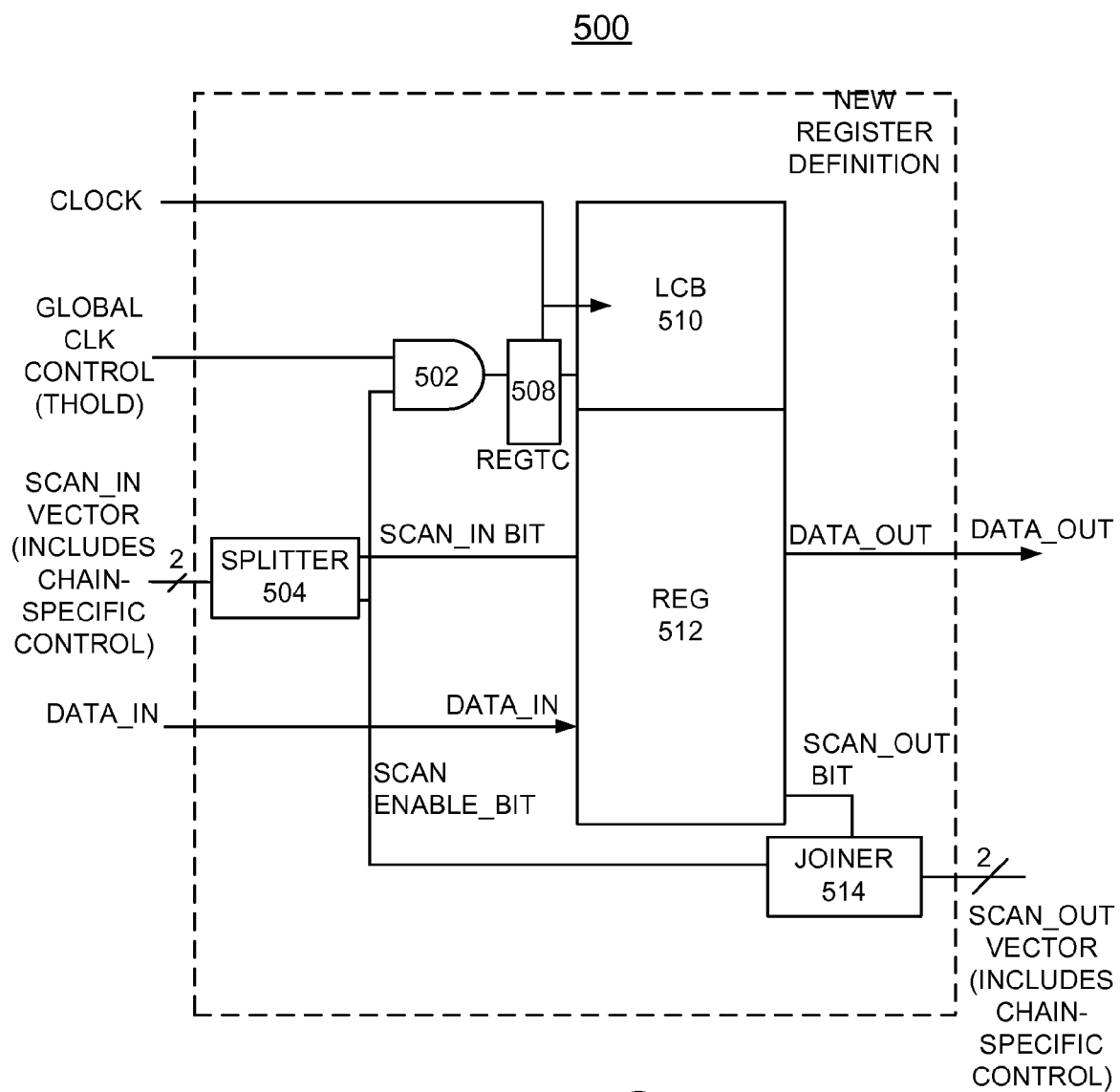
FIG. 5 illustrates another exemplary register latch for implementing scan-chain-specific control signals as an integral part of a scan chain in accordance with the preferred embodiment.

FIG. 5 illustrates another exemplary register latch to reduce setup time for implementing scan-chain-specific control signals as an integral part of a scan chain generally designated by the reference character 500 in accordance with the preferred embodiment. Register latch 500 includes an AND gate 502 receiving a global clock control THOLD signal and the chain-specific control signal or the scan_enable signal from a vector-splitter 504 receiving the 2-bit scan_in vector.

In register latch 500 another method is used to remove the additional setup time in the LCB 510 by providing an additional special THOLD staging latch REGTC 508 that is moved from outside to inside the register latch definition. The AND gated global clock-control THOLD signal by the chain-specific control signal at the output of AND gate 502 is applied to the special THOLD staging latch REGTC 508.

Register latch 500 includes a local clock buffer (LCB) 510 receiving a clock input CLOCK and the output of REGTC 508. Register latch 500 includes a register REG 512 receiving a data input DATA_IN and a scan data input SCAN_IN from the vector-splitter 504. The register REG 512 provides a data output DATA_OUT and a scan data output SCAN_OUT. The chain-specific control signal or the scan_enable signal from the vector-splitter 504 is routed around the register latch 500 to provide at a vector-joiner 514 a two-bit output vector SCAN_OUT VECTOR.

Figure 6:
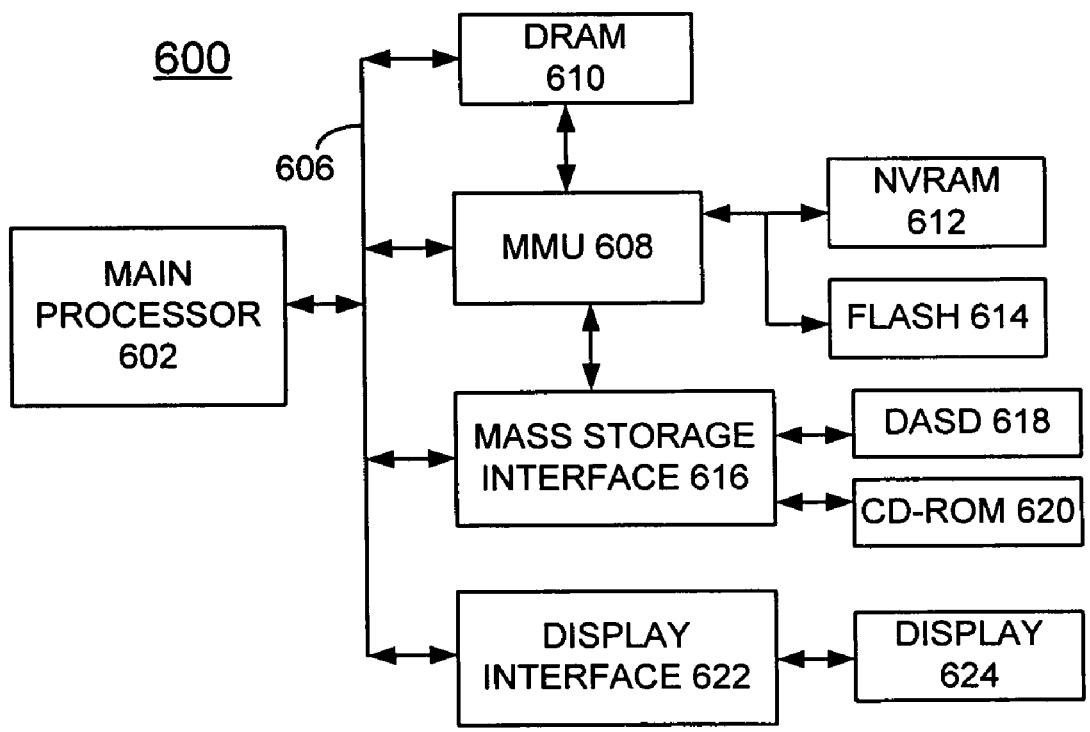
FIGS. 6 and 7 are block diagram representations illustrating a computer system and operating system for implementing scan chain designs having scan-chain-specific control signals as an integral part of a scan chain in accordance with the preferred embodiment.
Figure 7:
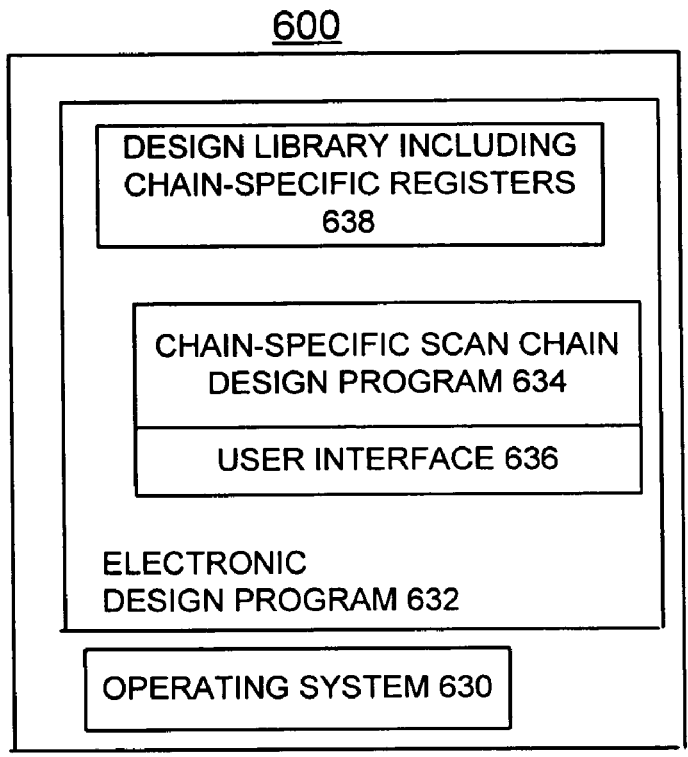

Referring now to the drawings, in FIGS. 6 and 7 there is shown a computer system generally designated by the reference character 600 for implementing scan-chain-specific control signals as an integral part of a scan chain in accordance with the preferred embodiment. Computer system 600 includes a main processor 602 or central processor unit (CPU) 602 coupled by a system bus 606 to a memory management unit (MMU) 608 and system memory including a dynamic random access memory (DRAM) 610, a nonvolatile random access memory (NVRAM) 612, and a flash memory 614. A mass storage interface 616 coupled to the system bus 606 and MMU 608 connects a direct access storage device (DASD) 618 and a CD-ROM drive 620 to the main processor 602. Computer system 600 includes a display interface 622 coupled to the system bus 606 and connected to a display 624.

Computer system 600 is shown in simplified form sufficient for understanding the present invention. The illustrated computer system 600 is not intended to imply architectural or functional limitations. The present invention can be used with various hardware implementations and systems and various other internal hardware devices, for example, multiple main processors.

As shown in FIG. 7, computer system 600 includes an operating system 630, an electronic design program 632, a chain-specific scan chain design program 634 of the preferred embodiment, a user interface 636, and a design library including chain-specific registers 638 of the preferred embodiment. The chain-specific register design library 638 includes one or more register designs for implementing scan-chain-specific control signals as an integral part of a scan chain in accordance with the preferred embodiment. For example, chain-specific register design library 638 includes one or more register designs including, such as the illustrated register latch 200, LCB 400, and register latch 500.

Figure 8:
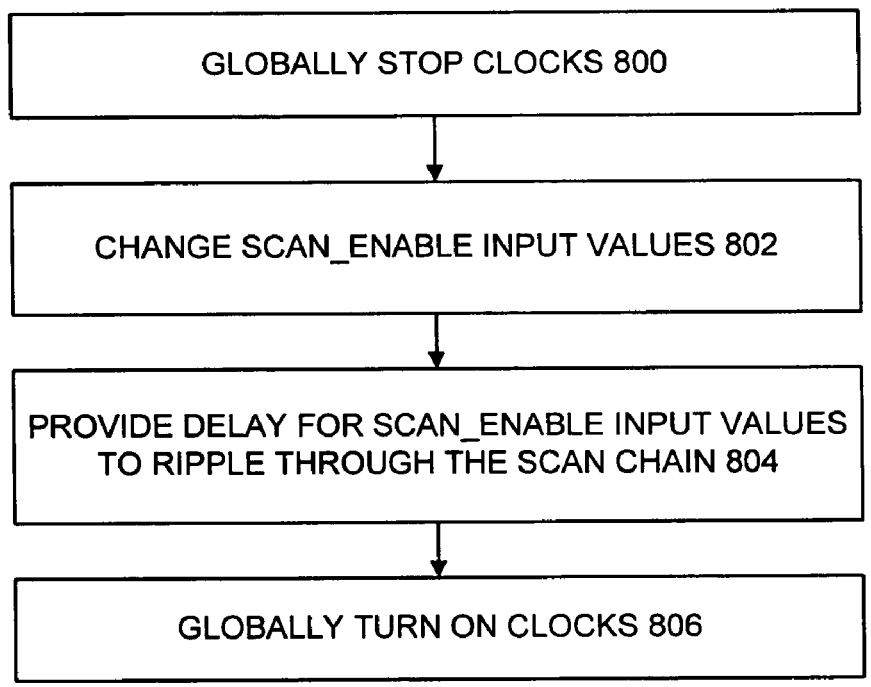
FIG. 8 is a flow chart illustrating exemplary steps for implementing settings change for scan-chain-specific control signals in accordance with the preferred embodiment.

Referring now to FIG. 8, there are shown exemplary steps for implementing a settings change for scan-chain-specific control signals in accordance with the preferred embodiment. The chain-specific clock control signals, such as scan_enables, typically do not change at all during normal chip operation. The chain-specific clock control signals are constant signals during chip operation. The exemplary steps shown in FIG. 8 can change the scan_enable settings of the preferred embodiment.

First globally stopping the clocks is provided as indicated in a block 800. Then the scan_enable input values of the preferred embodiment are changed as indicated in a block 802. A delay is provided to enable the scan_enable input values to ripple through the scan chain as indicated in a block 804. Then globally turning the clocks back on is provided as indicated in a block 806.

Figure 9:
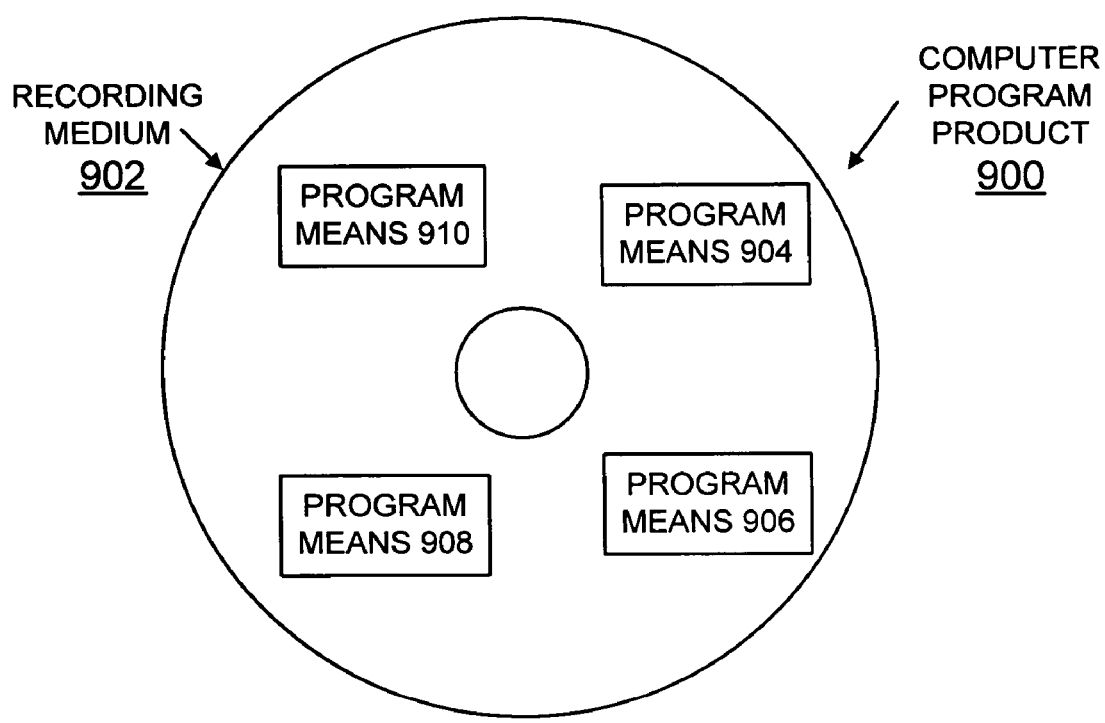
FIG. 9 is a block diagram illustrating a computer program product in 5 accordance with the preferred embodiment.

Referring now to FIG. 9, an article of manufacture or a computer program product 900 of the invention is illustrated. The computer program product 900 includes a recording medium 902, such as, a floppy disk, a high capacity read only memory in the form of an optically read compact disk or CD-ROM, a tape, or a similar computer program product. Recording medium 902 stores program means 904, 906, 908, 910 on the medium 902 for carrying out the methods for implementing designs with scan-chain-specific control signals as an integral part of a scan chain in accordance with the preferred embodiment in the system 600 of FIGS. 6 and 7.

A sequence of program instructions or a logical assembly of one or more interrelated modules defined by the recorded program means 904, 906, 908, 910, direct the computer system 600 for implementing scan-chain-specific control signals as an integral part of a scan chain of the preferred embodiment.

While the present invention has been described with reference to the details of the embodiments of the invention shown in the drawing, these details are not intended to limit the scope of the invention as claimed in the appended claims.

What is claimed is:

1. A method for implementing scan-chain-specific control signals as an integral part of a scan chain formed by a plurality of register latches, said method comprising the steps of:

applying a scan data input bit and a chain-specific scan control signal bit to a register latch;

providing the register latch with a logic gate for combining a global clock control signal and the chain-specific scan control signal bit;

routing the chain-specific scan control signal bit around the register latch for combining a scan data output bit of the register latch and the scan control signal bit; and providing a clock control signal distribution tree used with the scan chain with said clock control signal distribution tree being implemented independently of the chain-specific scan control signal bit.

2. The method for implementing scan-chain-specific control signals as recited in claim 1 wherein said global clock control signal includes a global clock signal.

3. The method for implementing scan-chain-specific control signals as recited in claim 1 includes eliminating chain-specific control signals from a clock control signal distribution tree used with the scan chain.

4. The method for implementing scan-chain-specific control signals as recited in claim 1 wherein the step of applying a scan data input bit and a scan control signal bit to the register latch includes providing a plurality of bits N including one bit for said scan data input bit and N-1 bits for each of a plurality of the chain-specific scan control signal bit of a plurality of chain-specific control signals.

5. The method for implementing scan-chain-specific control signals as recited in claim 1 wherein the step of providing the register latch with said logic gate includes providing an AND gate for receiving said chain-specific scan enable control signal bit and the global clock control signal.

6. The method for implementing scan-chain-specific control signals as recited in claim 4 includes providing a global clock control staging latch coupled to an output of said AND gate.

7. The method for implementing scan-chain-specific control signals as recited in claim 1 wherein the step of applying a scan data input bit and a chain-specific scan control signal bit to the register latch includes providing a logic built-in self-test (LBIST) engine for providing the scan data input bit to the scan chain; and said LBIST engine for receiving said chain-specific scan control signal bit from the scan chain.

* * * * *